United States Patent
Tsuji

(10) Patent No.: US 8,891,062 B2
(45) Date of Patent: Nov. 18, 2014

(54) ILLUMINATION OPTICAL SYSTEM, EXPOSURE APPARATUS, AND METHOD OF MANUFACTURING DEVICE

(75) Inventor: Toshihiko Tsuji, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 262 days.

(21) Appl. No.: 13/336,022

(22) Filed: Dec. 23, 2011

(65) Prior Publication Data
US 2012/0170013 A1 Jul. 5, 2012

(30) Foreign Application Priority Data

Jan. 1, 2011 (JP) .................................. 2011-000002

(51) Int. Cl.
*G03F 7/20* (2006.01)
(52) U.S. Cl.
CPC ........ *G03F 7/70075* (2013.01); *G03F 7/70091* (2013.01); *G03F 7/701* (2013.01); *G03F 7/70108* (2013.01); *G03F 7/702* (2013.01)
USPC .............................................. 355/67; 355/71
(58) Field of Classification Search
CPC . G03F 7/70091; G03F 7/701; G03F 7/70108; G03F 7/70233; G03F 7/70075
USPC .................. 355/53, 67, 71, 77; 359/851–854, 359/857–859
See application file for complete search history.

(56) References Cited

U.S. PATENT DOCUMENTS

| | | |
|---|---|---|
| 6,452,661 B1 | 9/2002 | Komatsuda |
| 6,703,625 B1 | 3/2004 | Doros |
| 7,538,856 B2 | 5/2009 | Kajiyama et al. |
| 2004/0124369 A1* | 7/2004 | Doros ........................ 250/492.1 |
| 2004/0233410 A1 | 11/2004 | Shiraishi |
| 2007/0132977 A1* | 6/2007 | Komatsuda ..................... 355/60 |
| 2008/0212327 A1 | 9/2008 | Singer et al. |
| 2009/0027641 A1 | 1/2009 | Kajiyama et al. |
| 2010/0053584 A1 | 3/2010 | Kajiyama et al. |

FOREIGN PATENT DOCUMENTS

| | | |
|---|---|---|
| EP | 0939341 A2 | 9/1999 |
| EP | 1014196 A2 | 12/1999 |
| EP | 1280008 A2 | 1/2003 |

(Continued)

OTHER PUBLICATIONS

Japanese Office Action for corresponding JP 2011-000002, mail date Nov. 19, 2012.

(Continued)

*Primary Examiner* — Colin Kreutzer
(74) *Attorney, Agent, or Firm* — Rossi, Kimms & McDowell LLP

(57) ABSTRACT

An illumination optical system which illuminates an illumination surface with light from a light source, includes a divider which divides light from the light source to generate a plurality of light beams, a first reflective integrator which uniformizes light intensity distributions of the plurality of light beams generated by the divider, a condenser which condenses the light beam from the first reflective integrator, a second reflective integrator which receives the light beam from the condenser and illuminates the illumination surface, and an aperture stop arranged between the second reflective integrator and the illumination surface, wherein the divider generates the plurality of light beams so that light beams each having a cross-sectional shape different from a cross-sectional shape of the light provided from the light source to the divider enter a plane on which the aperture stop is arranged.

9 Claims, 6 Drawing Sheets

(56) References Cited

FOREIGN PATENT DOCUMENTS

| | | |
|---|---|---|
| EP | 1811547 A1 | 7/2007 |
| JP | 11-312638 A | 11/1999 |
| JP | 2005-268265 A | 9/2005 |
| JP | 2009-032938 A | 2/2009 |
| JP | 2010-062281 A | 3/2010 |
| TW | 201003119 A | 1/2010 |
| TW | 201040672 A1 | 11/2010 |
| TW | 201040673 A1 | 11/2010 |
| WO | 2006/082738 A1 | 8/2006 |

OTHER PUBLICATIONS

Search Report and Written Opinion issued Mar. 28, 2013 for corres. NL2008048.
Taiwanese Office Action for corresponding TW100148933, mail date Jan. 20, 2014. English translation provided.

* cited by examiner

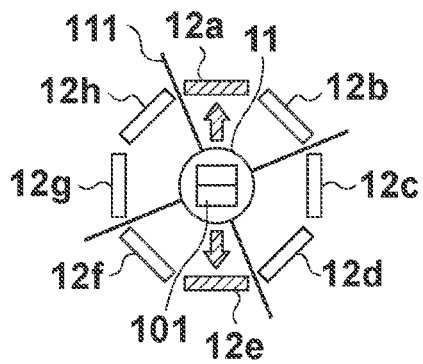
F I G. 2A
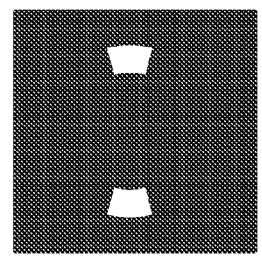
F I G. 2B
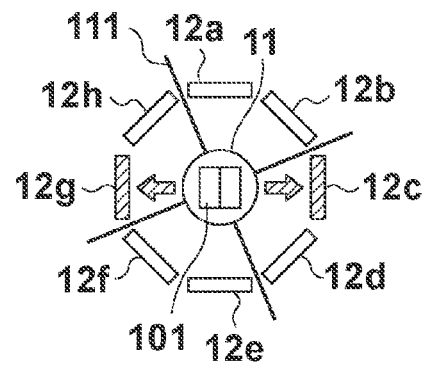
F I G. 2C
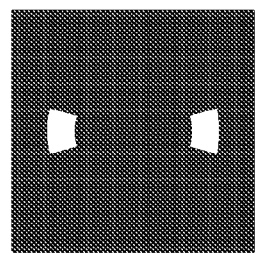
F I G. 2D

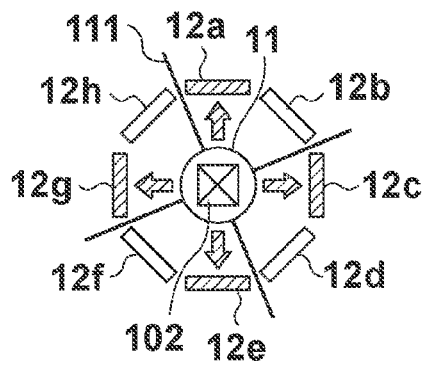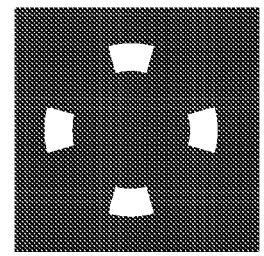
F I G. 3A      F I G. 3B
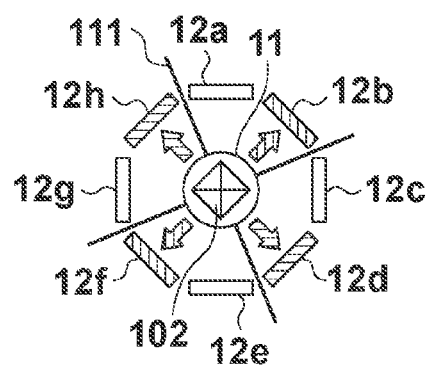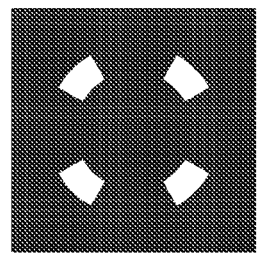
F I G. 3C      F I G. 3D

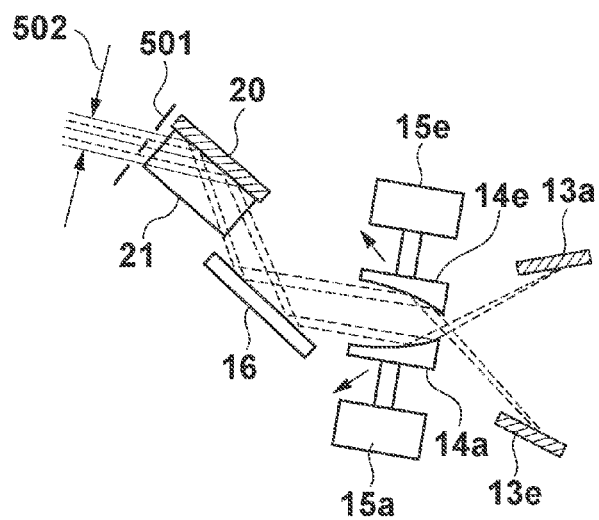 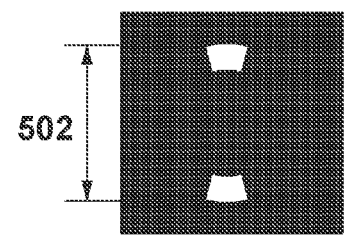
F I G. 5A          F I G. 5B
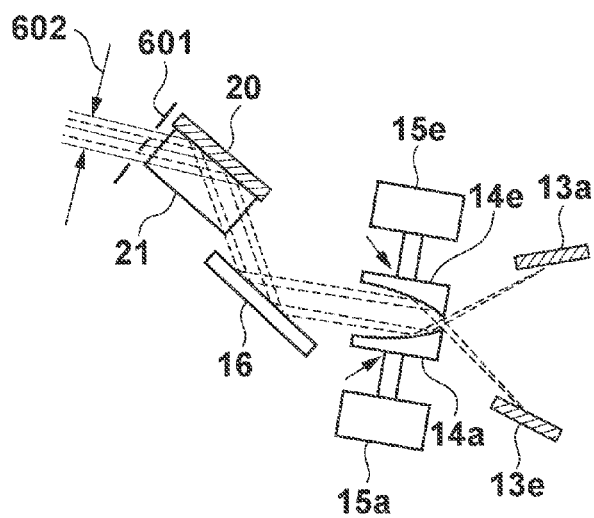 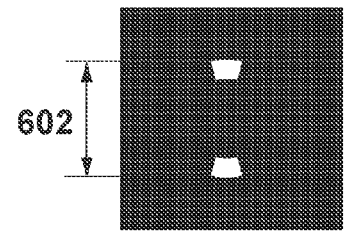
F I G. 6A          F I G. 6B

ILLUMINATION OPTICAL SYSTEM, EXPOSURE APPARATUS, AND METHOD OF MANUFACTURING DEVICE

BACKGROUND OF THE INVENTION

1. Field of the Invention

The present invention relates to an illumination optical system, an exposure apparatus, and a method of manufacturing a device.

2. Description of the Related Art

To improve the resolution of an exposure apparatus, the RET (Resolution Enhancement Technology) or modified illumination methods such as annular illumination and quadrupole illumination are commonly employed. Especially in an EUV (Extreme Ultraviolet) illumination optical system, the intensity of light which reaches a substrate decreases with an increase in number of mirrors, so an aperture stop is used to extract light instead of providing a mirror unit for modified illumination. In doing so, the amount of light beams shielded by the aperture stop is increased, resulting in illumination with low efficiency. FIG. 18 in Japanese Patent Laid-Open No. 11-312638, for example, describes an embodiment in which an EUV light beam from a light source enters fly-eye mirrors 20a and 20b without being uniformized into a parallel light beam by a mirror 15. In this embodiment, aperture stops 50a to 50f corresponding to desired modified illumination are inserted in front of the fly-eye mirror 20b to partially shield the light beam, thereby implementing modified illumination. In such a configuration, nonuniformity of the angle distribution of a light beam from the light source is directly reflected on the annular intensity distribution, so the uniformity of the effective light source distribution degrades, thus adversely affecting the resolution performance.

SUMMARY OF THE INVENTION

The present invention provides a technique advantageous in forming a uniform light intensity distribution in an illumination optical system while eliminating nonuniformity of the angle distribution of light from a light source.

The first aspect of the present invention provides an illumination optical system which illuminates an illumination surface with light from a light source, comprises: a divider which divides light from the light source to generate a plurality of light beams; a first reflective integrator which uniformizes light intensity distributions of the plurality of light beams generated by the divider; a condenser which condenses the light beam from the first reflective integrator; a second reflective integrator which receives the light beam from the condenser and illuminates the illumination surface; and an aperture stop arranged between the second reflective integrator and the illumination surface, wherein the divider generates the plurality of light beams so that light beams each having a cross-sectional shape different from a cross-sectional shape of the light provided from the light source to the divider enter a plane on which the aperture stop is arranged.

The second aspect of the present invention provides an exposure apparatus which exposes a substrate to light, the apparatus comprising: an illumination optical system defined as the first aspect of the present invention, which is configured to illuminate an original; and a projection optical system which projects a pattern of the original onto the substrate.

The third aspect of the present invention provides a method of manufacturing a device, the method comprising the steps of: exposing a substrate to light using an exposure apparatus defined as the second aspect of the present invention; and developing the substrate.

Further features of the present invention will become apparent from the following description of exemplary embodiments with reference to the attached drawings.

BRIEF DESCRIPTION OF THE DRAWINGS

FIGS. 2A to 2D are views showing an example in which a light beam is divided into two light beams;

FIGS. 3A to 3D are views showing an example in which a light beam is divided into four light beams;

FIGS. 5A and 5B are views illustrating a method of changing σ;

FIGS. 6A and 6B are views illustrating another method of changing σ;

DESCRIPTION OF THE EMBODIMENTS

Figure 1:
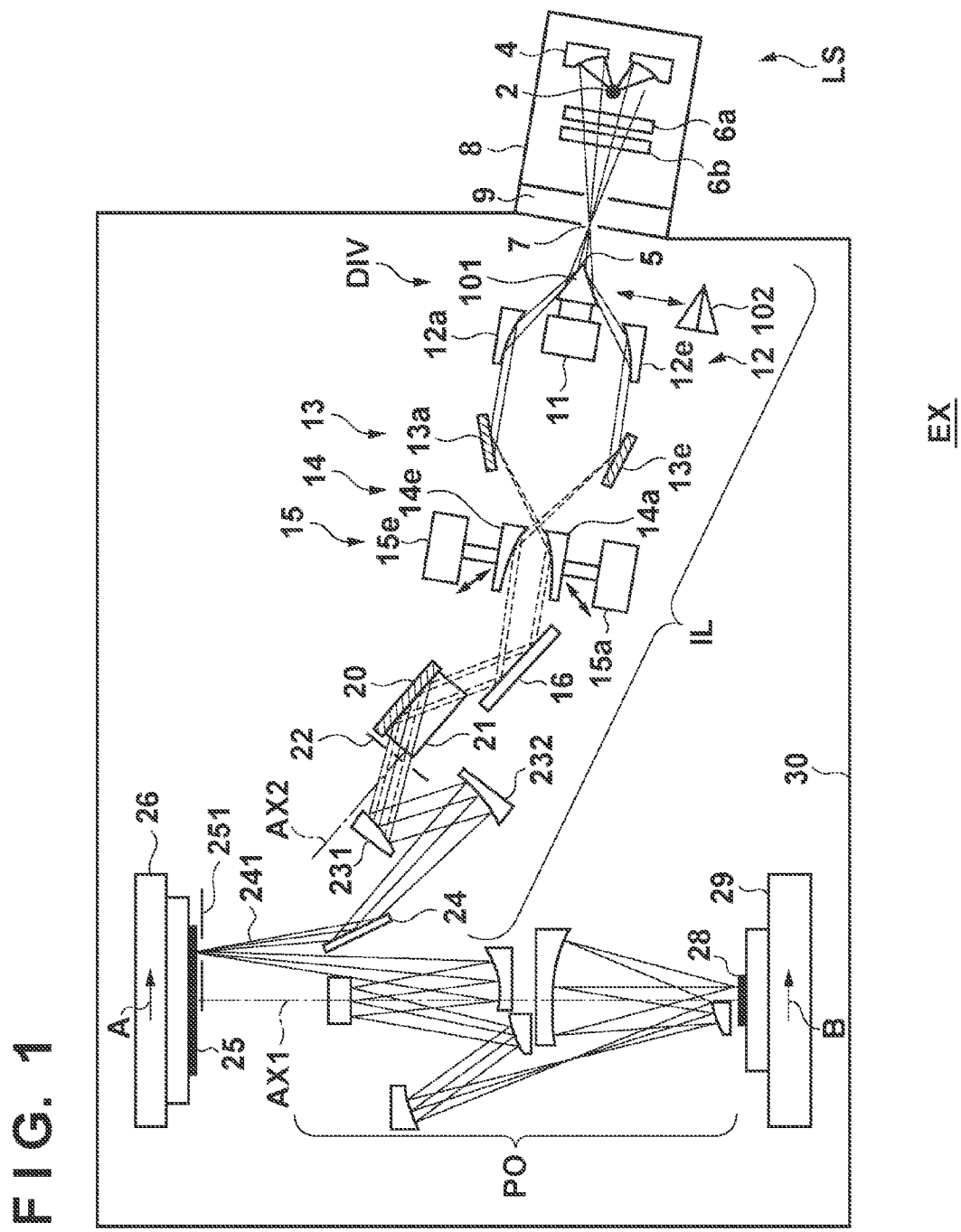
FIG. 1 is a view for explaining an exposure apparatus and an illumination optical system according to an embodiment of the present invention.

An exposure apparatus EX and an illumination optical system IL according to an embodiment of the present invention will be described below with reference to FIG. 1. The exposure apparatus EX according to the embodiment of the present invention includes a light source LS, the illumination optical system IL, a projection optical system PO, an original driving mechanism 26, and a substrate driving mechanism 29. The light source LS is accommodated in a vacuum chamber 8. The illumination optical system IL, projection optical system PO, original driving mechanism 26, and substrate driving mechanism 29 constitute the main body of the exposure apparatus EX, and are accommodated in a vacuum chamber 30. Although the exposure apparatus EX can be configured as, for example, an EUV exposure apparatus which uses EUV (Extreme Ultraviolet) light as exposure light, it may be configured as an exposure apparatus which uses another light (for example, laser light). However, a detailed example in which the exposure apparatus EX is configured as an EUV exposure apparatus will be given hereinafter.

The light source LS irradiates a plasma medium in the vacuum chamber 8 with light emitted by a high-power pulsed laser such as a $CO_2$ laser driven by a pulsed power source, thereby producing a plasma 2 with a high energy density from the plasma medium. An Sn liquid droplet, for example, can be used as the plasma medium. EUV light having a wavelength around 13.5 nm is generated by heat radiation from the plasma 2. A light source of a plasma generation scheme which uses such laser light is called a laser-produced plasma EUV light source.

As another light source LS, a light source which applies a pulsed current excited by a pulsed power source serving as a current supply source to a discharge header to discharge electricity, thereby producing a plasma 2 with a high energy density from a plasma medium between electrodes using energy generated by the discharge. Such a light source is called a discharge-produced plasma EUV light source. Various discharge excitation schemes such as Z pinch, plasma focus, and capillary discharge are available for a discharge-produced plasma EUV light source. An example of a plasma medium in a discharge-produced plasma EUV light source is Xe gas. Other examples of the plasma medium include an Sn vapor. In the latter case, the optical power of light having a wavelength around 13.5 nm can be increased.

A condensing mirror 4 such as a spheroidal mirror condenses EUV light 5 emitted by the plasma 2 on a pinhole aperture 7 provided on the boundary surface between the vacuum chambers 8 and 30. Not only a filter 6a for removing scattered particles (debris) which directly scatter to the front from the plasma and its vicinity can be arranged between the condensing mirror 4 and the aperture 7, but also a filter 6b for removing wavelength components unnecessary for EUV exposure can be arranged between these optical elements as needed. The vacuum chamber 8 of the light source LS and the vacuum chamber 30 of the main body of the exposure apparatus EX are connected to each other by a connector 9, and are differentially evacuated as needed.

Note that the condensing mirror 4 can be formed by forming a reflecting multilayer film on a base material so as to efficiently reflect EUV light. Since the condensing mirror 4 absorbs energy radiated from the plasma 2 at high temperatures, it heats to high temperatures during exposure of a substrate 28. Hence, the base material of the condensing mirror 4 is formed by a material such as a metal having a high thermal conductivity, and cooled by a cooling mechanism such as a water cooling mechanism. Similarly, mirrors which constitute the illumination optical system IL and projection optical system PO (to be described later) are provided with antireflection films so as to efficiently reflect EUV light, so their base materials can be formed by a material such as a metal having a high thermal conductivity, and cooled by a cooling mechanism.

The illumination optical system IL illuminates an illumination surface or an original (reflective original 25) with the EUV light having passed through the aperture 7. The illumination optical system IL will be exemplified below. The EUV light 5 provided from the light source LS via the aperture 7 enters a divider DIV. The divider DIV divides the EUV light 5 from the light source LS to generate a plurality of light beams. Note that the divider DIV includes a plurality of optical members 101, 102, and 103 (see FIG. 4 as for the optical member 103) having different functions, and one optical member selected from the plurality of optical members 101, 102, and 103 is inserted into the light path of EUV light from the light source LS. In an example shown in FIG. 1, the optical member 101 is inserted in the light path. The illumination optical system IL can include a manipulating mechanism for exchanging the optical members 101, 102, and 103 with each other. Among the optical members 101, 102, and 103, the optical member 101 inserted in the light path is held by a holding mechanism provided in a driving mechanism 11, and is driven by the driving mechanism 11. The driving mechanism 11 drives the divider DIV (optical members 101, 102, and 103) so as to change the traveling directions of the plurality of light beams generated by the divider DIV and, more specifically, so as to change the light intensity distribution formed on the plane on which an aperture stop 22 (to be described alter) is arranged.

The plurality of light beams generated by the divider DIV can be converted into parallel light beams by a converter 12 serving as an arbitrary constituent element. The converter 12 can include a plurality of concave mirrors 12a to 12h which convert the plurality of light beams, respectively, generated by the divider DIV into parallel light beams, as illustrated in FIGS. 2A to 4B. The plurality of light beams which are generated by the divider DIV and converted into parallel light beams by the converter 12 enter a first reflective integrator 13. The first reflective integrator 13 uniformizes the light intensity distributions of the plurality of incident light beams. The first reflective integrator 13 can include a plurality of reflective integrators 13a to 13h which uniformize the light intensity distributions of the plurality of light beams, respectively, which are generated by the divider DIV and converted into parallel light beams by the converter 12. Note that FIG. 1 shows only the reflective integrators 13a and 13e among the reflective integrators 13a to 13h. The plurality of reflective integrators 13a to 13h can be arranged in correspondence with the plurality of concave mirrors 12a to 12h, respectively.

A condenser 14 condenses the light from the first reflective integrator 13. The condenser 14 can include, for example, a plurality of condensing mirrors (concave mirrors) 14a to 14h corresponding to the plurality of reflective integrators 13a to 13h, respectively, and each condensing mirror condenses light from a corresponding reflective integrator among the plurality of reflective integrators 13a to 13h. Note that FIG. 1 shows only the condensing mirrors 14a and 14e among the condensing mirrors 14a to 14h. The illumination optical system IL can include a driving mechanism 15 which drives the condenser 14 so as to change the light intensity distribution formed on the plane on which the aperture stop 22 is arranged. The driving mechanism 15 can include a plurality of actuators 15a to 15h which drive the plurality of condensing mirrors 14a to 14h, respectively. Note that FIG. 1 shows only the actuators 15a and 15e among the actuators 15a to 15h.

Figure 7:
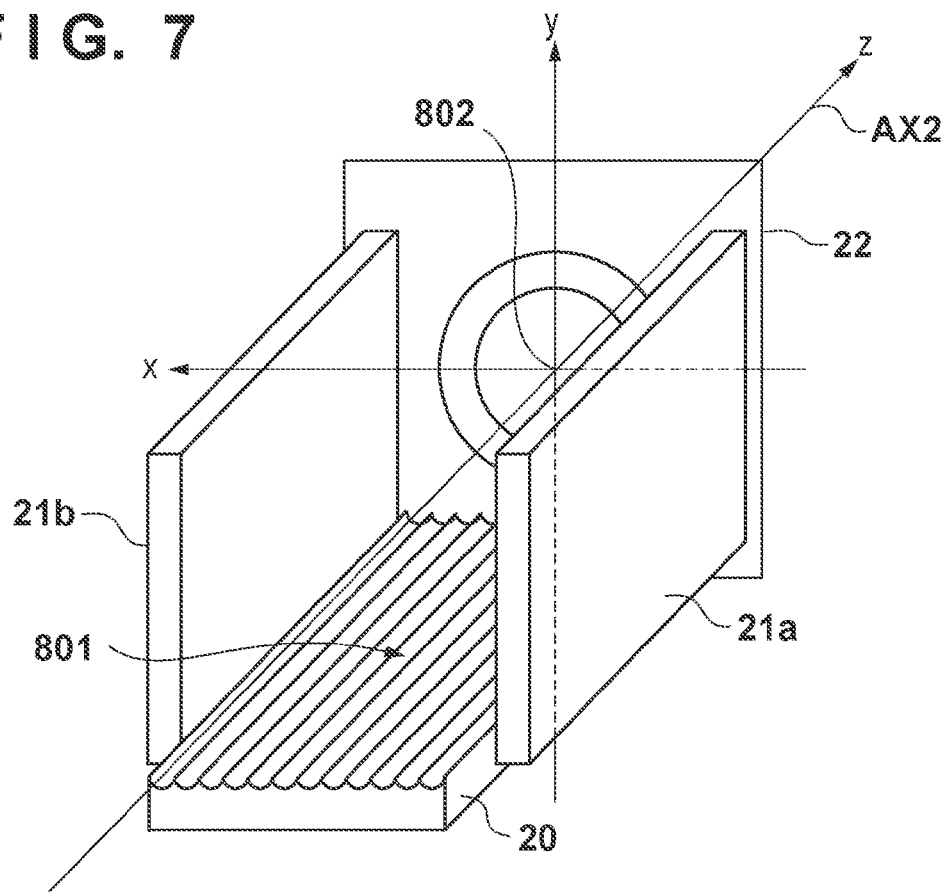
FIG. 7 is a view illustrating a second reflective integrator, auxiliary mirrors, and an aperture stop.

The light from the driving mechanism 15 enters a second reflective integrator 20 via a plane mirror 16. Note that the plane mirror 16 serves as an arbitrary constituent element. The second reflective integrator 20 can include a plurality of cylindrical mirrors, as illustrated in FIG. 7. When nearly parallel EUV light enters the second reflective integrator 20 including the plurality of cylindrical mirrors, a plurality of linear secondary light sources are formed near the surface of the second reflective integrator 20. The angle distribution of EUV light emitted by the plurality of linear secondary light sources has a cylindrical surface shape. The EUV light which enters the second reflective integrator 20 diverges upon being divided by the plurality of cylindrical mirrors of the second reflective integrator 20, and passes through the aperture stop 22. At this time, certain components of the EUV light beams from the plurality of cylindrical mirrors of the second reflective integrator 20 can be reflected by auxiliary mirrors 21a and 21b, and enter the aperture stop 22.

The EUV light having passed through the aperture stop 22 is shaped into an arcuated shape by an arc conversion optical system formed by a spherical or aspherical convex mirror 231 and concave mirror 232 on which reflecting multilayer films are formed. The EUV light shaped into an arcuated shape forms an arcuated illumination region having a uniform illuminance distribution in a region including an arcuated slit formed in a slit plate 251. In this arcuated illumination region, the light beams from the plurality of cylindrical mirrors of the second reflective integrator 20 are superposed on each other, thereby making it possible to improve the illuminance uniformity while attaining high efficiency. That is, uniform arcuated illumination is performed at high efficiency. The reflective original 25 held by the original driving mechanism 26 is illuminated with EUV light which passes through the arcuated slit formed in the slit plate 251 and has an arcuated cross-section.

As the aperture stop 22, various aperture stops, as will be described later, can be prepared so that they can be switched with each other by an aperture stop switching mechanism (not shown) such as a turret. The auxiliary mirrors 21a and 21b can be a pair of opposing plane mirrors which are arranged perpendicularly to the array surface of the second reflective integrator 20, on which the plurality of cylindrical mirrors are arrayed. The aperture stop 22 can be a plate member arranged perpendicularly to the array surface of the second reflective integrator 20. A plane mirror 24 which bends, toward the reflective original 25, an illumination light beam 241 serving as a light beam on the image side of the arc conversion optical system formed by the convex mirror 231 and concave mirror 232 can be arranged between the concave mirror 232 and the slit plate 251. The position and angle of the mirror surface of the plane mirror 24 are finely adjusted by a driving mechanism (not shown), thereby making it possible to adjust the incident angle of the illumination light beam 241 on the reflective original 25. Upon bending the illumination light beam 241 by the plane mirror 24, the direction of the arc in the arcuated illumination region formed by the illumination light beam 241 reverses. The center of the arc in the arcuated illumination region coincides with an optical axis AX1 of the projection optical system PO. The image-side principal ray of the arc conversion optical system and the object-side principal ray of the projection optical system PO coincide with each other to have the reflective original 25 as their reflecting surface. The plane mirror 24 is useful in improving the freedom of the arrangement of the arc conversion optical system.

In the illumination optical system IL illustrated in FIG. 1, all optical elements from the divider DIV to the second reflective integrator 20 can be formed by total-reflecting mirrors. When EUV light is used, a multilayer mirror needs to be used for a small incident angle, while a total-reflecting mirror formed by a monolayer film can be used for a large incident angle. Since a total-reflecting mirror has a reflectance higher than a multilayer mirror, a more efficient illumination optical system can be formed using a mirror or integrator that exhibits a large incident angle.

The circuit pattern of the reflective original 25 illuminated with EUV light having an arcuated cross-section is projected by the projection optical system PO onto the substrate 28 held by the substrate driving mechanism 29, thereby exposing the substrate 28 to light. The substrate driving mechanism 29 includes a substrate stage which mounts a substrate chuck that holds the substrate 28, and a mechanism which drives the substrate stage, and can drive the substrate 28 about six axes (the X-, Y-, and Z-axes, and axes along rotation directions about the former axes). The position of the substrate stage can be measured by a length measurement device such as a laser interferometer. Letting M be the projection magnification of the projection optical system PO, shot regions on the substrate 28 are scanned and exposed while, for example, the reflective original 25 is scanned at a velocity v in a direction indicated by an arrow A, and the substrate 28 is synchronously scanned at a velocity v/M in a direction indicated by an arrow B.

The projection optical system PO is formed by a plurality of multilayer reflecting mirrors, and is designed so that a narrow arcuated region which is off the optical axis AX1 has good imaging performance. The projection optical system PO is configured to reduce and project the pattern of the reflective original 25 onto the substrate 28, and serves as an image-side (substrate-side) telecentric system. The object side (reflective original side) of the projection optical system PO normally has a non-telecentric configuration so as to avoid physical interference with the illumination light beam 241 which enters the reflective original 25, and the object-side principal ray is tilted by about 6° with respect to the normal direction to the reflective original 25.

A method of dividing a light beam by the divider DIV will be exemplified below with reference to FIGS. 2A to 4B. FIG. 2A schematically shows the optical member 101 (divider DIV) and concave mirrors 12a to 12h (converter 12) when viewed from the side of the light source LS. The optical member 101 serving as the divider DIV has two reflecting surfaces arranged in a wedge shape so as to divide light from the light source LS into two light beams. The two reflecting surfaces serve as total-reflecting mirrors. The converter 12 includes the eight concave mirrors 12a to 12h. The eight concave mirrors 12a to 12h are held by a holding mechanism 111 so as to form an octagon in a cross-section perpendicular to the optical axis. The holding mechanism 111 is arranged so as not to shield the divided light beams. When light from the light source LS is divided into two light beams by the optical member 101 having the two reflecting surfaces arranged in a wedge shape, the two light beams generated by division enter the two concave mirrors among the eight concave mirrors 12a to 12h.

In an example shown in FIG. 2A, the two light beams enter the concave mirrors 12a and 12e. The two light beams reflected by the concave mirrors 12a and 12e then enter the reflective integrators 13a and 13e corresponding to the concave mirrors 12a and 12e, among the plurality of reflective integrators 13a to 13h which constitute the first reflective integrator 13. The light intensity distributions of the two light beams which enter the reflective integrators 13a and 13e are uniformized by the reflective integrators 13a and 13e, respectively. The light beams from the reflective integrators 13a and 13e are condensed by the condensing mirrors 14a and 14e corresponding to the reflective integrators 13a and 13e, among the plurality of condensing mirrors 14a to 14h which constitute the condenser 14. The light beams from the condensing mirrors 14a and 14e enter the second reflective integrator 20 via the plane mirror 16. The second reflective integrator 20 illuminates the reflective original 25 via the convex mirror 231, concave mirror 232, and plane mirror 24.

The light beams which come from the condensing mirrors 14a and 14e and leave the second reflective integrator 20 form a light intensity distribution corresponding to Y dipole illumination on the plane on which the aperture stop 22 is arranged, as illustrated in FIG. 2B. That is, a light intensity distribution having a cross-sectional shape different from that (typically, a circular or ring-shaped cross-sectional shape) of light provided from the light source LS to the divider DIV is formed on the plane on which the aperture stop 22 is arranged. This is done using the divider DIV to divide light provided from the light source LS.

FIG. 2C schematically shows the optical member 101 when it is rotated through 90° from a state, shown in FIG. 2A, by the driving mechanism 11. In this case, two light beams generated by the optical member 101 enter the two concave mirrors 12c and 12g among the eight concave mirrors 12a to 12h. The two light beams reflected by the concave mirrors 12c and 12g enter the reflective integrators 13c and 13g corresponding to the concave mirrors 12c and 12g, among the plurality of reflective integrators 13a to 13h which constitute the first reflective integrator 13. The light intensity distributions of the two light beams which enter the reflective integrators 13c and 13g are uniformized by the reflective integrators 13c and 13g. The light beams from the reflective integrators 13c and 13g are condensed by the condensing mirrors 14c and 14g corresponding to the reflective integrators 13c and 13g, among the plurality of condensing mirrors 14a to 14h which constitute the condenser 14. The light beams from the condensing mirrors 14c and 14g enter the second reflective integrator 20 via the plane mirror 16. In the above-mentioned way, the light beams which come from the condensing mirrors 14c and 14g and leave the second reflective integrator 20 form a light intensity distribution corresponding to X dipole illumination on the plane on which the aperture stop 22 is arranged, as illustrated in FIG. 2D.

FIG. 3A schematically shows the optical member 102 (divider DIV) and concave mirrors 12a to 12h (converter 12) when viewed from the side of the light source LS. The optical member 102 serving as the divider DIV has four reflecting surfaces arranged in a four-sided pyramidal shape so as to divide light from the light source LS into four light beams. The four reflecting surfaces serve as total-reflecting mirrors. The four light beams generated by the optical member 102 form a light intensity distribution corresponding to quadrupole illumination on the plane on which the aperture stop 22 is arranged, as illustrated in FIG. 3B. That is, a light intensity distribution having a cross-sectional shape different from that (typically, a circular or ring-shaped cross-sectional shape) of light provided from the light source LS to the divider DIV is formed on the plane on which the aperture stop 22 is arranged. This is done using the divider DIV to divide light provided from the light source LS. FIG. 3C schematically shows the optical member 102 when it is rotated through 45° from a state, shown in FIG. 3A, by the driving mechanism 11. In this case, a light intensity distribution, as illustrated in FIG. 3D, is formed on the plane on which the aperture stop 22 is arranged.

Figure 4A:
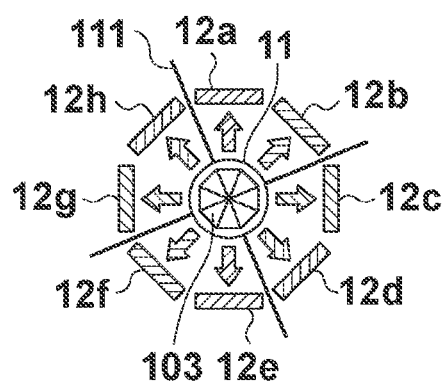
FIGS. 4A and 4B are views showing an example in which a light beam is divided into eight light beams.
Figure 4B:
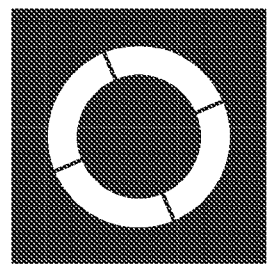

FIG. 4A schematically shows the optical member 103 (divider DIV) and concave mirrors 12a to 12h (converter 12) when viewed from the side of the light source LS. The optical member 103 serving as the divider DIV has eight reflecting surfaces arranged in an eight-sided pyramidal shape so as to divide light from the light source LS into eight light beams. The eight reflecting surfaces serve as total-reflecting mirrors. In this case, the eight concave mirrors 12a to 12h of the converter 12, the eight reflective integrators 13a to 13h of the first reflective integrator 13, and the eight condensing mirrors 14a to 14h of the condenser 14 are used. Eight light beams generated by the optical member 103 form a light intensity distribution corresponding to annular illumination on the plane on which the aperture stop 22 is arranged, as illustrated in FIG. 4B. Although an example in which the divider DIV divides light from the light source LS into a maximum of eight light beams has been given in this embodiment, the maximum number of light beams into which the divider DIV divides light from the light source LS may be larger or smaller than eight.

Figure 8:
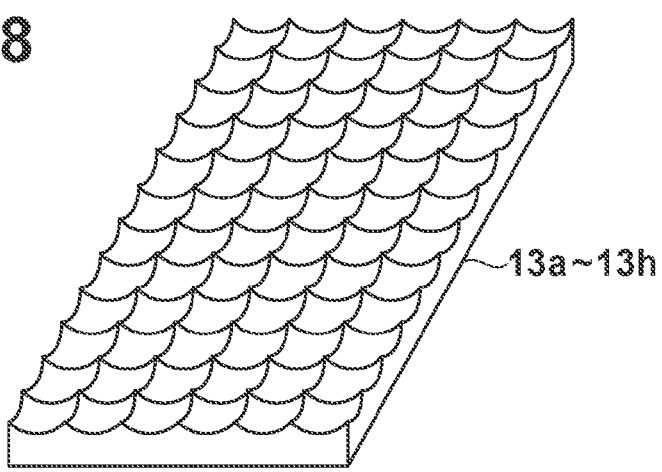
FIG. 8 is a perspective view illustrating a first reflective integrator.

FIG. 8 is a perspective view schematically showing an example of the configuration of each of the reflective integrators 13a to 13h which constitute the first reflective integrator 13. Each of the reflective integrators 13a to 13h has an array of a plurality of concave mirrors. Each of the reflective integrators 13a to 13h serves as a total-reflecting mirror, and can have, for example, a paraboloidal or toroidal shape.

A method of setting the coherence factor (σ) to a desired value in the above-mentioned various illumination modes will be described next with reference to FIGS. 5A to 6B. The coherence factor (σ) is the ratio between the object-side NA of the projection optical system and the NA of the illumination light beam. In general, an image having high contrast is obtained at low σ, whereas an image faithful to a mask pattern is obtained at high σ. FIG. 5A schematically shows a method of increasing the value of σ in dipole illumination described with reference to FIG. 2A. Referring to FIG. 5A, the light beams from the reflective integrators 13a and 13e enter the condensing mirrors 14a and 14e, respectively, of the condenser 14. The actuators 15a and 15e of the driving mechanism 15 drive the condensing mirrors 14a and 14e, respectively, in the direction in which the interval between the condensing mirrors 14a and 14e widens. This makes it possible to widen an interval 502 between two poles (dipoles) on the plane on which the aperture stop 22 is arranged, as illustrated in FIG. 5B. This means that the value of σ increases. In quadrupole illumination and annular illumination as well, the value of σ can be increased in the same way.

FIG. 6A schematically shows a method of decreasing the value of σ in dipole illumination described with reference to FIG. 2A. Referring to FIG. 6A, the light beams from the reflective integrators 13a and 13e enter the condensing mirrors 14a and 14e, respectively, of the condenser 14. The actuators 15a and 15e of the driving mechanism 15 drive the condensing mirrors 14a and 14e, respectively, in the direction in which the interval between the condensing mirrors 14a and 14e narrows. This makes it possible to narrow an interval 602 between two poles (dipoles) on the plane on which the aperture stop 22 is arranged, as illustrated in FIG. 6B. This means that the value of σ decreases. In quadrupole illumination and annular illumination as well, the value of σ can be decreased in the same way.

As described above, according to this embodiment, an optimum illumination mode and σ value can be set in accordance with the pattern to be formed on the substrate, without decreasing the illuminance on the substrate surface.

Although an example in which an integrator including a plurality of cylindrical mirrors is adopted as the second reflective integrator 20 has been described in the above-mentioned embodiment, a configuration in which two fly-eye mirrors that exhibit a small incident angle are opposed to each other may be adopted. However, to improve the efficiency, it is more advantageous to use a single total-reflecting integrator as the second reflective integrator 20.

The arrangement of the second reflective integrator 20, two auxiliary mirrors 21, and aperture stop 22 will be exemplified next with reference to FIG. 7. Referring to FIG. 7, reference numeral 801 denotes the direction of the central principal ray of EUV light which enters the second reflective integrator 20. This central principal ray passes through the vicinity of the center of the second reflective integrator 20 nearly within the y-z cross-section. A position 802 is nearly the center of the pupil plane of the arc conversion optical system formed by the convex mirror 231 and concave mirror 232. FIG. 7 describes an x-y-z coordinate system having the position 802 as its origin. The z-axis nearly coincides with a coaxis AX2 of the arc conversion optical system.

The auxiliary mirrors 21a and 21b are arranged along the direction, in which the generating lines of each cylindrical mirror serving as a constituent element of the second reflective integrator 20 run, perpendicularly to the array surface of the second reflective integrator 20, on which the plurality of cylindrical mirrors are arrayed. In an example shown in FIG. 7, the two auxiliary mirrors 21a and 21b are opposed to sandwich the aperture of the aperture stop 22 between them. A driving mechanism which adjusts the interval between the two auxiliary mirrors 21a and 21b may be provided. The surface of a plate member which constitutes the aperture stop 22 is arranged on the exit side nearly perpendicularly to the array surface of the second reflective integrator 20, on which the plurality of cylindrical mirrors are arrayed.

To finely adjust the effective light source distribution, the aperture stop 22 may be arranged to be tilted by a small angle (about 1° to 2°) with respect to a plane exactly perpendicular to the array surface of the second reflective integrator 20, on which the plurality of cylindrical mirrors are arrayed. In this manner, when the aperture stop 22 has a small tilt with respect to a plane exactly perpendicular to the array surface as well, this configuration can fall into the category of a configuration in which the aperture stop 22 is perpendicular to the array surface. To allow, for example, adjustment of the effective light source distribution and the telecentricity, a driving mechanism which adjusts the angle of the aperture stop 22 with respect to the array surface of the second reflective integrator 20, on which the plurality of cylindrical mirrors are arrayed, may be provided.

Upon arranging the auxiliary mirrors 21a and 21b, a certain component of light reflected by the second reflective integrator 20 can be guided to pass through the aperture stop 22 and used for illumination. This is advantageous in efficiently illuminating the arcuated region. Japanese Patent Laid-Open No. 2009-032938 describes details of a method of providing auxiliary mirrors to improve the efficiency of the illumination system.

A method of manufacturing a device according to a preferred embodiment of the present invention is suitable for manufacturing a device such as a semiconductor device or a liquid crystal device. This method can include a step of exposing a substrate coated with a photosensitive agent to light using the above-mentioned exposure apparatus EX, and a step of developing the exposed substrate. This method can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-000002, filed Jan. 1, 2011, which is hereby incorporated by reference herein in its entirety.

What is claimed is:

1. An illumination optical system which illuminates an illumination surface with light from a light source, the system comprising:
    a divider which divides light from the light source to generate a plurality of light beams;
    a first reflective integrator including a plurality of reflective integrators respectively corresponding to the plurality of light beams generated by the divider, wherein the plurality of reflective integrators are configured to respectively uniformize the light intensity distributions of the plurality of light beams;
    a condenser which condenses the light beams from the first reflective integrator; a second reflective integrator which receives the light beams from the condenser and illuminates the illumination surface; and
    an aperture stop arranged between the second reflective integrator and the illumination surface,
    wherein the divider generates the plurality of light beams so that light beams each having a cross-sectional shape different from a cross-sectional shape of the light provided from the light source to the divider enter a plane on which the aperture stop is arranged.

2. The system according to claim 1, wherein the condenser includes a plurality of condensing mirrors corresponding to the plurality of reflective integrators, and each of the condensing mirrors condenses light from a corresponding reflective integrator among the plurality of reflective integrators.

3. The system according to claim 1, further comprising a driving mechanism which drives the condenser so as to change a light intensity distribution formed on the plane on which the aperture stop is arranged.

4. The system according to claim 1, further comprising a converter which is arranged between the divider and the first reflective integrator, and converts the plurality of light beams generated by the divider into parallel light beams.

5. The system according to claim 4, wherein the converter includes a plurality of concave mirrors which convert the plurality of light beams, respectively, generated by the divider into parallel light beams.

6. The system according to claim 1, further comprising a driving mechanism which drives the divider so as to change traveling directions of the plurality of light beams generated by the divider.

7. The system according to claim 1, wherein the divider includes a plurality of optical members having different functions, each of the plurality of optical members is configured to divide the light from the light source to generate the plurality of light beams, and one optical member selected from the plurality of optical members is inserted into a light path of the light from the light source.

8. An exposure apparatus which exposes a substrate to light, the apparatus comprising:
    an illumination optical system configured to illuminate an original, the system including a divider which divides light from a light source to generate a plurality of light beams, a first reflective integrator including a plurality of reflective integrators respectively corresponding to the plurality of light beams generated by the divider, wherein the plurality of reflective integrators are configured to respectively uniformize the light intensity distributions of the plurality of light beams, a condenser which condenses the light beams from the first reflective integrator, a second reflective integrator which receives the light beams from the condenser and illuminates the illumination surface, and an aperture stop arranged between the second reflective integrator and the illumination surface, wherein the divider generates the plurality of light beams so that light beams each having a cross-sectional shape different from a cross-sectional shape of the light provided from the light source to the divider enter a plane on which the aperture stop is arranged; and
    a projection optical system which projects a pattern of the original onto the substrate.

9. A method of manufacturing a device, the method comprising the steps of:
    exposing a substrate to light using an exposure apparatus that includes an illumination optical system configured to illuminate an original; and
    developing the substrate,
    wherein the illumination optical system includes a divider which divides light from a light source to generate a plurality of light beams, a first reflective integrator including a plurality of reflective integrators respectively corresponding to the plurality of light beams generated by the divider, wherein the plurality of reflective integrators are configured to respectively uniformize the light intensity distributions of the plurality of light beams, a condenser which condenses the light beams from the first reflective integrator, a second reflective integrator which receives the light beams from the condenser and illuminates the illumination surface, and an aperture stop arranged between the second reflective integrator and the illumination surface, wherein the divider generates the plurality of light beams so that light beams each having a cross-sectional shape different from a cross-sectional shape of the light provided from the light source to the divider enter a plane on which the aperture stop is arranged; and a projection optical system which projects a pattern of the original onto the substrate.

* * * * *